(12) United States Patent
Kearney

(10) Patent No.: US 6,731,232 B1
(45) Date of Patent: May 4, 2004

(54) PROGRAMMABLE INPUT RANGE SAR ADC

(75) Inventor: Thomas Paul Kearney, Cork (IR)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/330,717

(22) Filed: Dec. 27, 2002

(51) Int. Cl.[7] .............................................. H03M 1/34
(52) U.S. Cl. ..................... 341/163; 341/144; 341/155; 341/172
(58) Field of Search ................................ 341/144, 155, 341/172, 163

(56) References Cited

U.S. PATENT DOCUMENTS 5,684,487 A * 11/1997 Timko .......................... 341/172
5,861,831 A * 1/1999 Murden et al. ............. 341/139
6,388,589 B1 * 5/2002 Arai ............................. 341/78

* cited by examiner

*Primary Examiner*—Peguy JeanPierre
(74) *Attorney, Agent, or Firm*—Wolf, Greenfield & Sacks, P.C.

(57) ABSTRACT

A programmable input voltage range analog-to-digital converter in which a split gate oxide process allows the use of high voltage (±15 volt) switches on the same silicon substrate as standard sub-micron 5 volt CMOS devices. With this process, the analog input voltage can be sampled directly onto one or more sampling capacitors without the need for prior attenuation circuits. By only sampling on a given ratio of the sampling capacitors, the analog input can be scaled or attenuated to suit the dynamic range of the SAR (successive approximation register) ADC itself. In the system of the present invention, the sampling capacitor can be the actual capacitive redistribution digital-to-analog converter (CapDAC) used in the SAR ADC itself, or a separate capacitor array. By selecting which bits of the CapDAC or separate sampling array to sample on, one can program the input range. Once the analog input signal has been attenuated to match the allowed dynamic range of the SAR converter, traditional SAR techniques can be used to convert the input signal to a digital word.

24 Claims, 6 Drawing Sheets

PROGRAMMABLE INPUT RANGE SAR ADC

FIELD OF THE INVENTION

This invention relates generally to scaling of analog input signals and in particular to scaling both bipolar and unipolar input signals to the dynamic range of an ADC prior to acquisition and conversion, and is more particularly directed toward sampling an analog input signal through high-voltage transmission gates onto a selected combination of sampling capacitors to program the input range of a SAR ADC.

BACKGROUND OF THE INVENTION

Multi-input, wide dynamic range bipolar and unipolar successive approximation analog-to-digital converters (ADCs) have traditionally used resistor divider networks at the analog input to scale the input signal to the dynamic range of the converter before acquisition and conversion can take place. This method of attenuating the input signal prior to conversion by the ADC has been used very successfully in the past. However, it has a number of distinct disadvantages.

First of all, in the traditional resistor divider approach the analog input source always sees a resistive load to ground or some reference voltage. The source must be able to drive this load. Second, the resistor divider network consumes power both from the internal reference and from the analog input source. The third problem is that this prior art technique does not allow the user an easy method for programming the allowed analog input range. A fourth disadvantage is the fact that the size of the input resistors will limit the full power bandwidth of the converter.

The nodes of the resistor network that form the resistor divider can be made accessible to the user via pins on an integrated circuit (IC). The user then configures the resistor divider network via hardware connections to suit the analog input range required. However, if the user wishes to change the range, then the hardware has to be re-wired.

Consequently, a need arises for an analog input voltage scaling technique that is easily adaptable to integrated circuit applications, does not require the input signal to drive a resistive load to ground, minimizes power consumption, and is easily programmable in the event that the allowed analog input voltage range requires alteration.

SUMMARY OF THE INVENTION

These needs and others are satisfied by the programmable input voltage range system and methodology of the present invention, in which a split gate oxide process allows the use of high voltage (±15 volt) switches on the same silicon substrate as standard sub-micron 5 volt CMOS devices. With this process, the analog input voltage can be sampled directly onto the sampling capacitor without the need for prior attenuation circuits. By only sampling on a given ratio of the sampling capacitor, the analog input can be scaled or attenuated to suit the dynamic range of the SAR (successive approximation register) ADC itself.

In the system of the present invention, the sampling capacitor can be the actual capacitive redistribution digital-to-analog converter (CapDAC) used in the SAR ADC itself, or a separate capacitor array. By selecting which bits of the CapDAC or separate sampling array to sample on, one can program the input range. Once the analog input signal has been attenuated to match the allowed dynamic range of the SAR converter, traditional SAR techniques can be used to convert the input signal to a digital word.

In this manner, many of the problems of traditional methods are overcome. The analog source sees a capacitive load, not a resistive load to ground—therefore, no DC power is required from the source. Second, no additional power is consumed in biasing a resistor divider network. And last of all, by selecting which bits of the capacitive redistribution DAC or separate sampling array to sample onto, one can program, through software, the analog input range.

In accordance with one aspect of the present invention, a programmable input voltage range analog-to-digital converter comprises a successive approximation analog-to-digital converter (SAR ADC) having a characteristic dynamic range, and an input voltage scaling network in which the input voltage is sampled onto one or more selected sampling capacitors to scale the input voltage to substantially match the characteristic dynamic range of the SAR ADC. In one form of the invention, the input voltage scaling network is a capacitive redistribution digital-to-analog converter forming a part of the SAR ADC.

A network of high voltage sampling switches may be interposed between the input voltage and the input voltage scaling network, such that range decoder logic selects one or more elements of the input voltage scaling network on which the input voltage is sampled. The input voltage range may be bipolar.

In another form of the invention, a network of low-voltage to high-voltage level shifters couples control signals to the high voltage sampling switches. Preferably, the range decoder logic is responsive to a range selection control word written into an associated range register. The range register may be programmable via a digital communication interface. It is preferred that the digital communication interface be a serial, bi-directional communication interface to accommodate both programming of the range register by a user, and read-back of the range register contents for verification, as well as for programming other functionality of the SAR ADC itself.

In accordance with another aspect of the present invention, a SAR ADC comprises a capacitive redistribution digital-to-analog converter (CapDAC) having an output coupled to a comparator, SAR logic that controls iterative sampling of a SAR ADC input signal and monitors the output of the comparator, an input voltage scaling network in which the input voltage is sampled onto one or more selected sampling capacitors to scale the input voltage to substantially match the characteristic dynamic range of the SAR ADC, a network of high voltage sampling switches interposed between the input voltage and the input voltage scaling network, such that the input voltage is selectively sampled onto one or more of the sampling capacitors, range decoder logic that controls the network of high voltage sampling switches to select one or more of the sampling capacitors, and a range register to which a range selection control word is written, the range decoder logic being responsive to the range selection control word.

The CapDAC may form at least a part of the input voltage scaling network, and the input voltage may be sampled onto one or more selected sampling capacitors of the CapDAC to scale the input voltage to substantially match the characteristic dynamic range of the SAR ADC. In the alternative, the input voltage scaling network may comprise a network of sampling capacitors independent of the CapDAC array.

Further objects, features, and advantages of the present invention will become apparent from the following description and drawings.

DETAILED DESCRIPTION OF THE INVENTION

Figure 1:
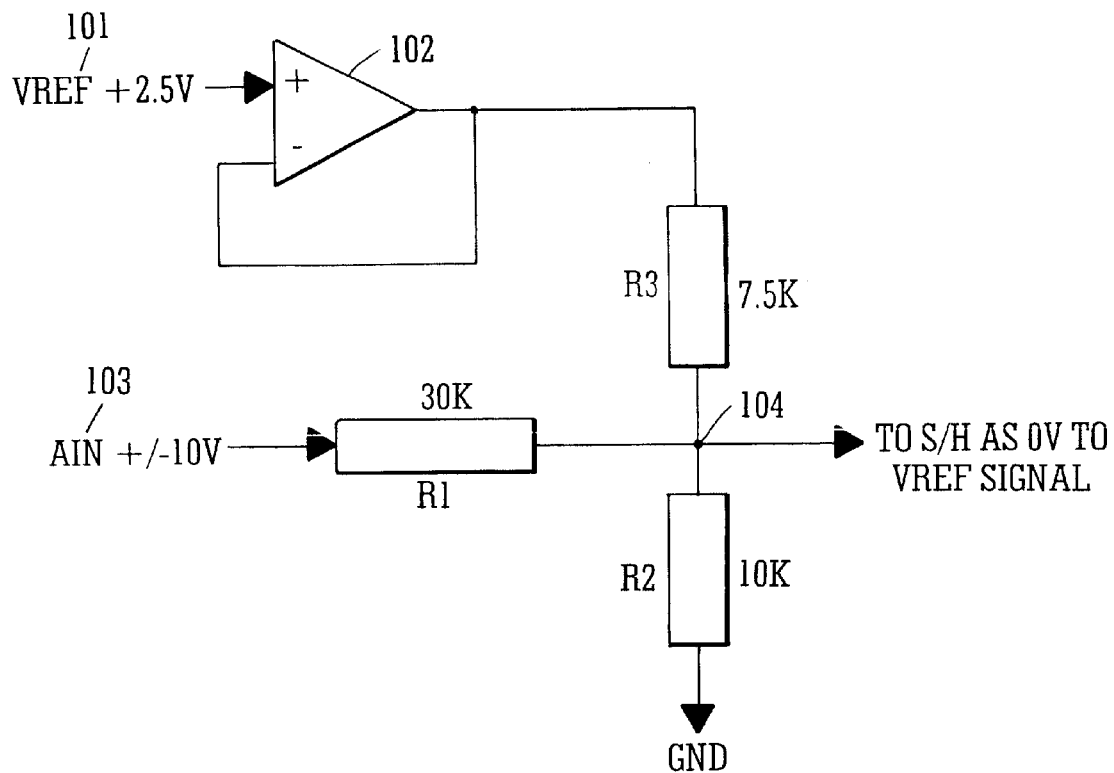
FIG. 1 depicts a resistor divider circuit of the prior art used to attenuate analog input signals prior to conversion.

There is described herein a programmable input range SAR ADC that offers distinct advantages when compared to the prior art. FIG. 1 illustrates the traditional method used to attenuate wide range bipolar and unipolar analog input signals prior to conversion. A reference voltage Vref, in this example +2.5 volts, is applied to the input of a buffer 102. The buffered reference voltage is applied to the top of a resistor divider formed from resistors R1, R2, and R3.

The analog input signal Ain, which, in this exemplary circuit, ranges between −10 volts and +10 volts, is applied to the voltage divider input 103. The reference voltage Vref serves as a bias voltage for the voltage divider, with the result that the divider network scales and level-shifts the input signal. The analog input voltage Ain, as it varies from −10 volts to +10 volts, produces a variation at the common node 104 from zero volts to +2.5 volts. It is this output node 104, with its scaled output voltage, that is generally coupled to the sample and hold input of a SAR ADC. It should be noted that the analog input signal Ain in this prior art network must drive 40 K (kilohms) to ground.

Figure 2:
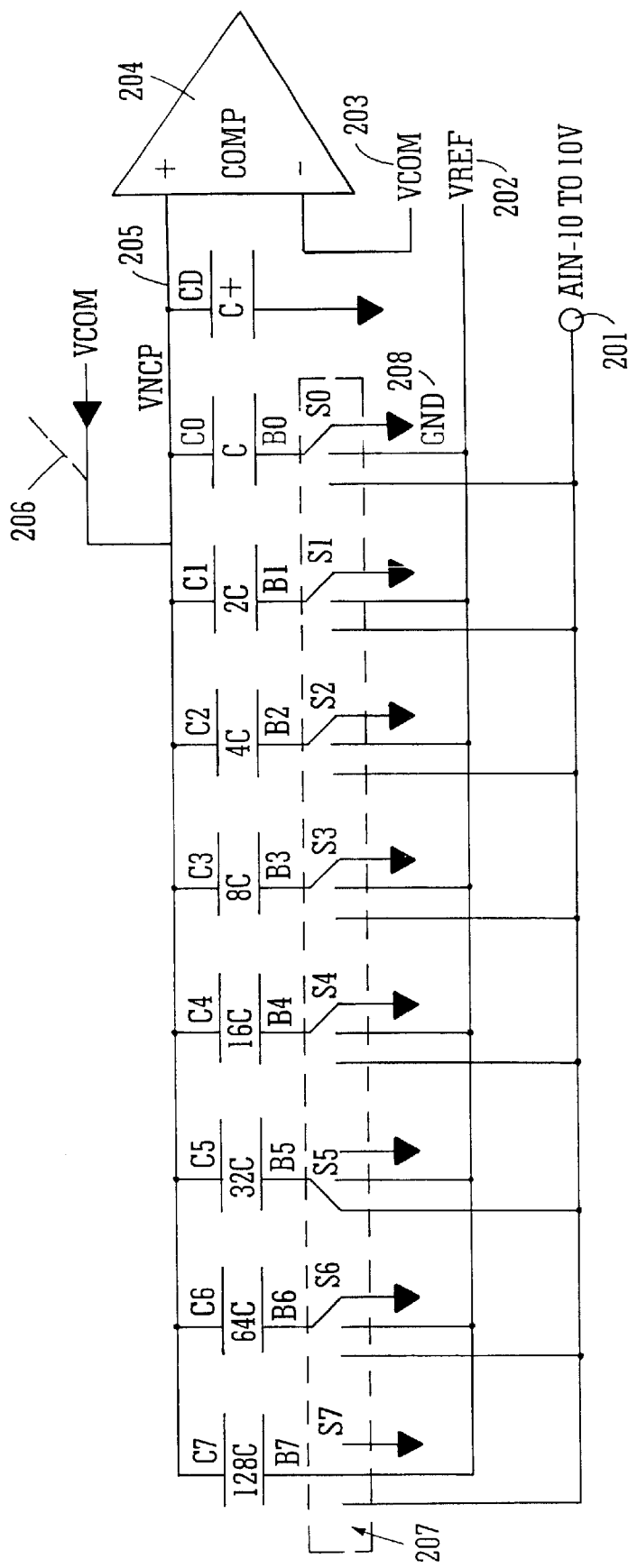
FIG. 2 illustrates a bipolar analog input signal being sampled onto a CapDAC array in accordance with the principles of the present invention.

FIG. 2 illustrates a bipolar ±10 volt) analog input signal being sampled onto an 8-bit CapDAC array in accordance with the principles of the present invention. The switches to the analog input signal are ±15 volt switches that are capable of directly sampling the bipolar input signal. The switches are described in greater detail below.

It should be noted with respect to FIG. 2 that the comparator and all the SAR logic of the ADC can be implemented using 5 volt sub-micron CMOS technology. Only the analog input switches are required to be fabricated using ±15 volt CMOS devices that use a thicker gate-oxide to deal with the higher gate voltages required.

The charge equation during sampling for the ±10 volt input range is as follows:

$$Q_{ncp} = C_{tot} * \{-Ain*(32C/256C) + V_{com}\} = C_{tot} * V_{ncp} \quad (1)$$

Where $C_{tot} = 256C$

That is, the analog input voltage sampled will be:

$$V_{ncp} = -Ain/8 + V_{com} \quad (2)$$

If $V_{com}$ is equal to 1.25 volts, then, for any analog input voltage in the range ±10 volts, the sampled analog input is between 0 volts and 2.5 volts. If the reference voltage is 2.5 volts, then the analog input is kept within the dynamic range of the converter, and the bipolar input signal can be converted using the usual SAR techniques.

In order to program the input range, one simply selects which bits of the CapDAC array to sample onto. This is illustrated for an 8-bit example in Table 1 below:

| Input Range | MSB B7 | B6 | B5 | B4 | B3 | B2 | B1 | LSB B0 | $V_{ncp}$ after sampling |
|---|---|---|---|---|---|---|---|---|---|
| ±10 volts | Vref | GND | Ain | GND | GND | GND | GND | GND | $-Ain/8 + V_{com}$ |
| ±5 volts | Vref | Ain | GND | GND | GND | GND | GND | GND | $-Ain/4 + V_{com}$ |
| ±2.5 volts | Vref | Ain | Ain | Ain | Ain | Ain | Ain | Ain | $-Ain/2 + V_{com}$ |
| 0 to +10 v | GND | Ain | GND | GND | GND | GND | GND | GND | $-Ain/4 + V_{com}$ |
| 0 to +5 v | GND | Ain | Ain | Ain | Ain | Ain | Ain | Ain | $-Ain/2 + V_{com}$ |
| 0 to +2.5 v | Ain | Ain | Ain | Ain | Ain | Ain | Ain | Ain | $-Ain + V_{com}$ |

In this example, only three bits are needed to select the range: a polarity bit (to indicate whether the input signal is bipolar or unipolar) and two range bits. Table 2 below illustrates the selection bit values for a number of input ranges.

| Input Range | Polarity Bit | Range Bit1 | Range Bit0 |
|---|---|---|---|
| ±10 volts | High | Low | Low |
| ±5 volts | High | Low | High |
| ±2.5 volts | High | High | High |
| 0 to +10 v | Low | Low | Low |
| 0 to +5 v | Low | Low | High |
| 0 to +2.5 v | Low | High | High |

It should be noted that for bipolar signals the MSB (the Polarity Bit) is held at the reference voltage during sampling. The reason for this will become apparent later in the description.

As noted above, FIG. 2 illustrates a capacitive redistribution DAC, or CapDAC, comprised of a collection of binary weighted capacitors $C_7$ through $C_0$, and a "dummy" capacitor (or terminating capacitor) $C_D$ located closest to the comparator 204. The value of $C_D$ is substantially equal to the capacitance of the LSB capacitor $C_0$. In the circuit of FIG. 2, the terminating capacitor does not sample the analog input, but is rather held at ground to help with minimizing offsets. The 8-bit capacitor array of FIG. 2 is shown in sample mode. The total capacitance of the array is 256C, where C is the unit capacitance for the illustrated implementation.

In this exemplary embodiment, the MSB B7 is tied to Vref 202 during sampling by switch S7, part of the array 207 of analog switches that will be discussed further below. The third most significant bit, B5, is tied to the analog input voltage 201 through switch S5. When the sampling period is completed, the charge accumulated from the analog input is transferred to the top plate of the capacitor array by switching S5 to ground 208. The common mode switch 206 is opened first so that total charge across the sampling capacitor is conserved.

Thus, in this example, the analog input signal is attenuated by a factor of 8. Therefore, assuming an input signal that varies between +10 and −10 volts, the comparator 204 actually sees ±1.25 volts. If the common mode voltage Vcom 203 is 1.25 volts, then the input signal is kept within the common mode range of the comparator 204. Known successive approximation techniques can then be used to digitize the input signal.

An examination of the MSB bit trial is instructive. As noted previously, the MSB was tied to Vref (2.5 volts) during sampling. Post-sampling, the MSB remains at Vref until a decision is made regarding what to do with the MSB. Just by way of example, if the analog input signal happened to be positive (+10 volts, for example), the voltage at the non-inverting input of the comparator (the NCP node 205) would be given by equation (2) above as $-Ain/8+V_{com}$. In the case where the common mode voltage $V_{com}$ is +1.25 volts, then $V_{ncp}=0$ volts. The output of comparator 204 would be a logic LOW level.

One would expect to have the NCP node converge to the common mode voltage. In order to accomplish this, the MSB is left connected to Vref, since switching this point to ground would transfer negative charge to the top plate of the capacitor array and cause the NCP voltage to diverge from the common mode voltage. The SAR logic can be structured to set the first bit of the data output to a logic "1" under these circumstances, since the logic will know that the input is bipolar.

The second MSB B6 bit trial begins by switching B6 from ground to Vref using switch S6. This transfers a positive charge of weighting Vref/4 to the top plate of the capacitor array. The equation for the NCP voltage 205 now becomes:

$$V_{ncp}=-Ain/8+V_{com}+Vref/4 \quad (3)$$

Since the sampled analog input signal in this example was +10 volts, the common mode voltage is +1.25 volts, and the reference voltage Vref is +2.5 volts, the voltage at the NCP node 205 is 0.625 volts. The comparator output is still a logic LOW, but the NCP voltage is beginning to converge on the common mode voltage. Hence, the second MSB B6 is left tied to Vref and the SAR logic interprets this as a logic "1" and sets the second bit of the data output to "1." The remaining bit trials occur in the same fashion until all 8 bits have been tested and the NCP node 205 is within 1 LSB of the common mode voltage.

In the event that the analog input voltage were negative, the opposite would occur. If an input voltage of −10 volts were applied as the analog input signal, equation (2) above indicates that the NCP node voltage would be 2.5 volts. The comparator output would be a logic HIGH and the SAR logic would interpret this, switch the MSB from Vref to ground, and set the first bit of the data output to a logic "0." For the second MSB bit trial, B6 would be switched to Vref, the NCP node would settle to +1.875 volts, and the comparator output would still be HIGH. The SAR logic would reject this bit by switching it to ground. Thus, the SAR process would continue until the NCP node converges on the common mode voltage. An equation for the NCP voltage during bit trials is given below:

$$V_{ncp}=-Ain/8+V_{com}+[-\overline{B7}*(Vref/2)+B6*(Vref/4)+ \ldots +B0*(Vref/256]$$

The Vref/2 term (the MSB) has a negative sign and is also multiplied by the inverse of bit 7. This is because the Vref/2 term is only included when B7 is a logic "0" (i.e., if the actual analog input voltage is negative in polarity). Hence, the MSB behaves like a sign bit.

Figure 3:
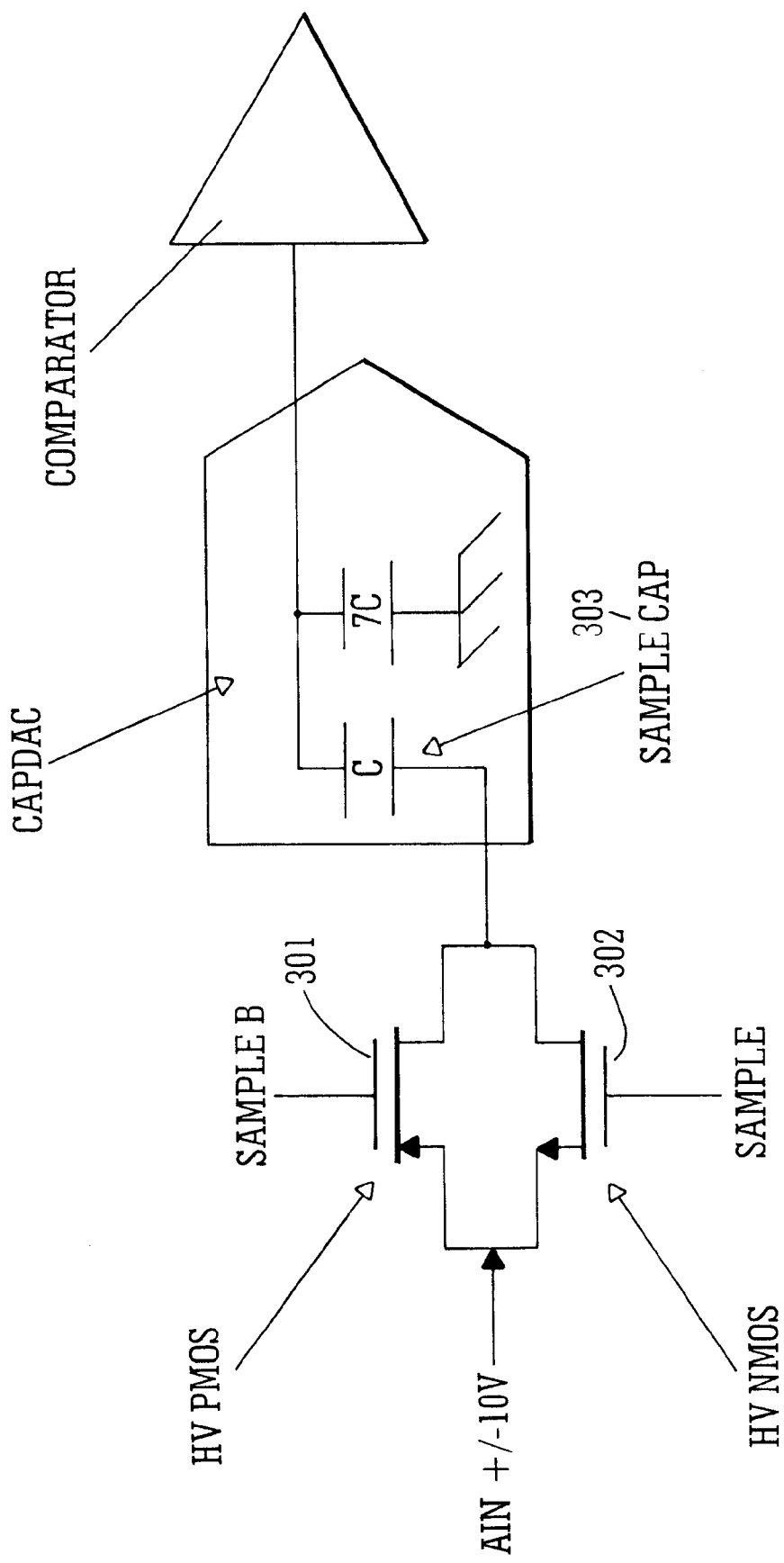
FIG. 3 is a simplified diagram of a switching transistor arrangement suitable for use in the present invention.

FIG. 3 is a simplified diagram of a switching arrangement suitable for use in the present invention. In order to accommodate analog input signals in the range from −10 to +10 volts, a transmission gate is formed from a pair of parallel connected, high voltage PMOS 301 and NMOS 302 transistors. Preferably, the devices illustrated will withstand a 30 volt differential between any two terminals, and provide an adequate safety margin when dealing with input signals in the ±10 volt range. The high voltage devices 301, 302 take the analog input signal and switch it directly onto a sampling capacitor 303. Of course, high voltage control signals are required for the gates of the high voltage transistors 301, 302, but these control signals can be provided by simple level shifting from 5 volt CMOS levels.

Figure 4:
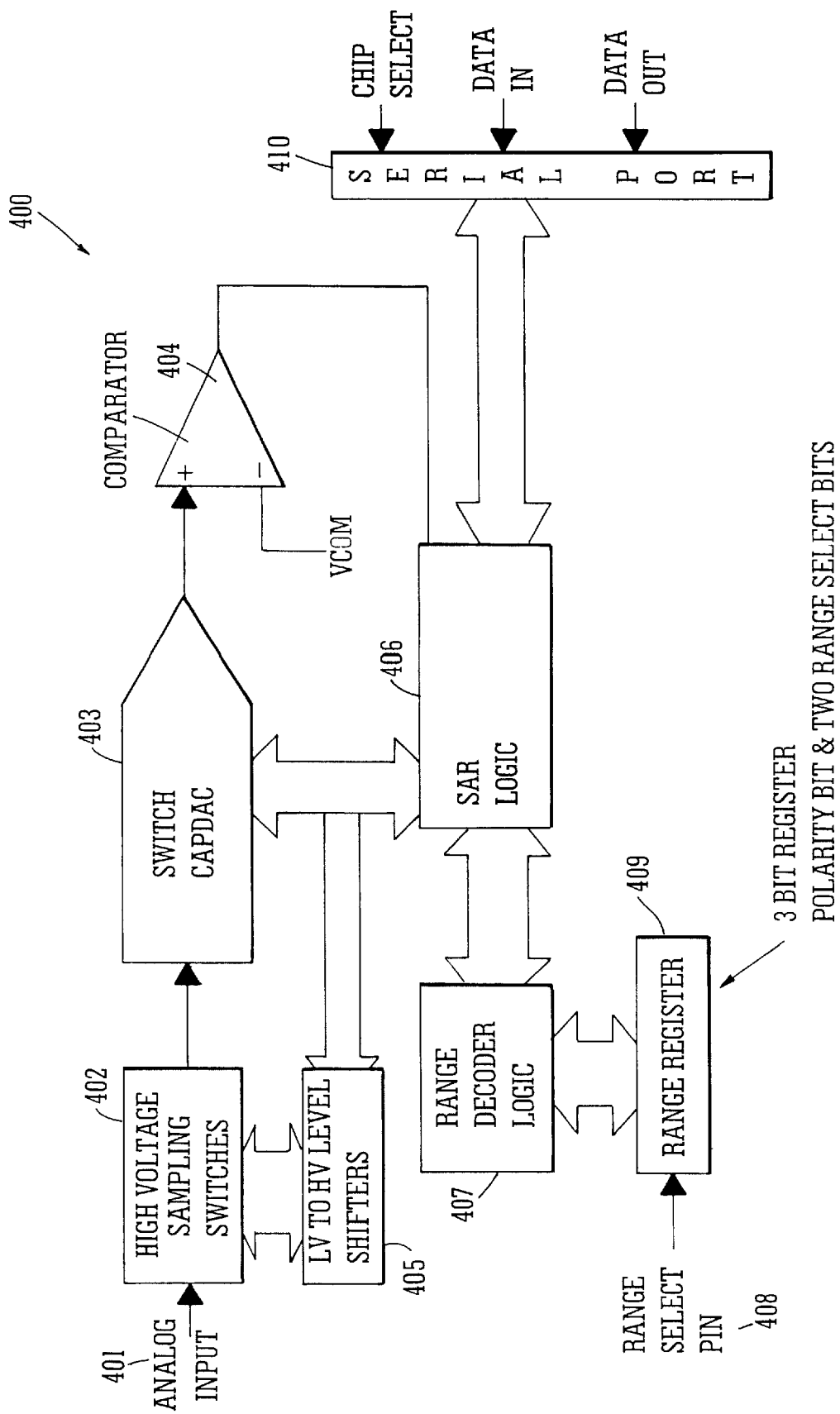
FIG. 4 is a block diagram of a complete SAR ADC incorporating the principles of the present invention.

FIG. 4 is a block diagram of a complete SAR ADC system incorporating programmable input range features in accordance with the present invention, and generally depicted by the numeral 400. An analog input signal 401 is applied to one or more capacitors of a CapDAC array 403 through an array of high-voltage switches 402. The SAR logic 406, which also controls signal acquisition and conversion in a known manner, controls which capacitors of the CapDAC array the input signal is sampled onto.

The SAR logic 406 does this based upon range decoder logic 407 that receives a range programming input from a range register 409. The range decoder logic 407 is described in greater detail subsequently. It is sufficient for the moment to note that the contents of the range register 409 may be altered by writing to the register over a conventional serial port 410. Allowing the user to access the range register 409 provides a software programming capability for the range of the SAR ADC 400.

Figure 5:
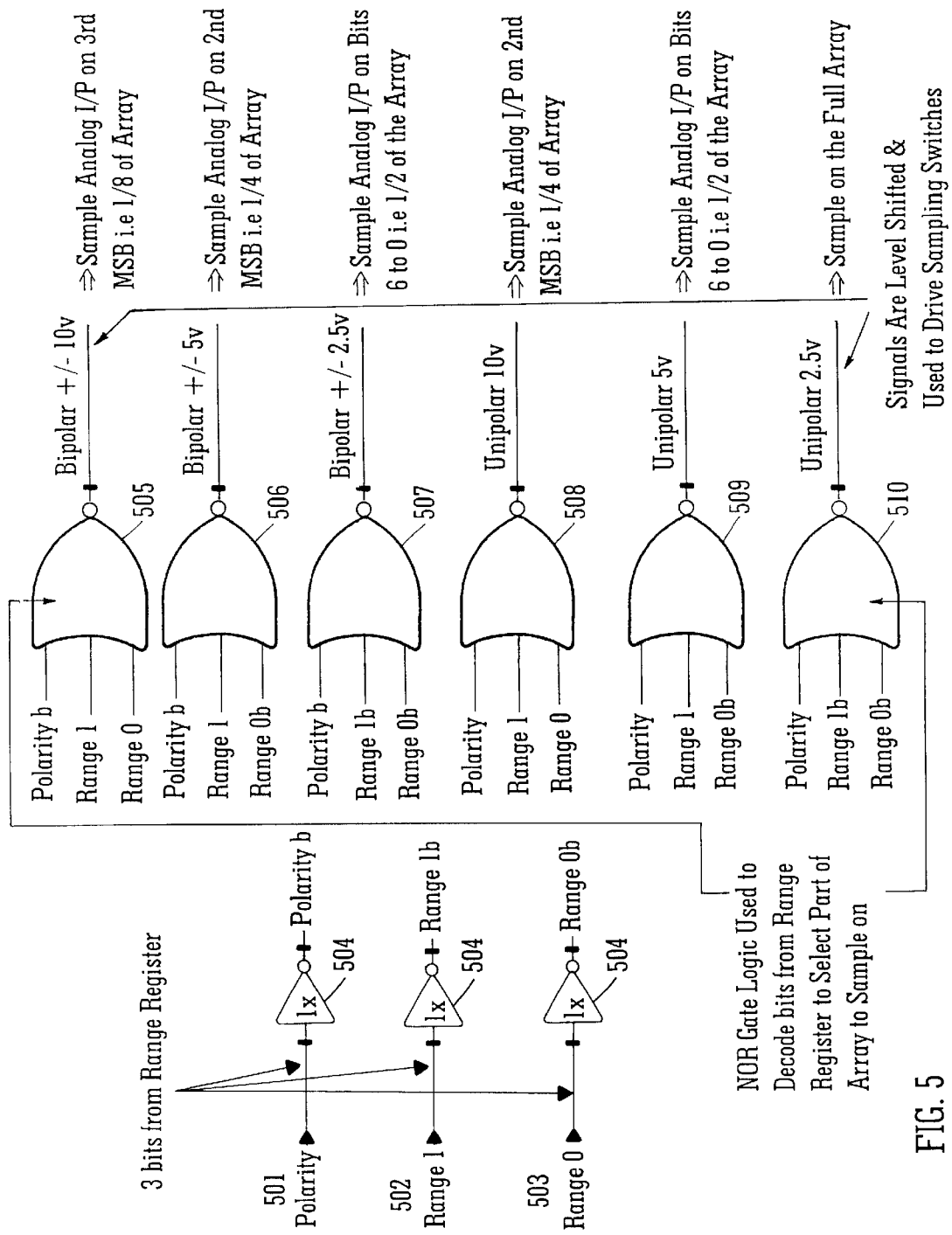
FIG. 5 depicts range decoder logic suitable for use with the present invention.

FIG. 5 provides a detailed view of the range decoder logic. Of course, a number of logic implementations would suffice for this application. The implementation of FIG. 5 is simply one satisfactory way of generating a suitable set of ranges for the SAR ADC. There are three input signals that control the range of the SAR ADC. These are the Polarity Bit 501, the Range1 Bit 502, and the Range0 Bit 503. Each of these signals is applied to an inverter 504 so that both the signals and their logic complements are available to the decoder section.

The decoder itself is an array of NOR gates to which unique combinations of the input signals and their complements are applied. For example, the complement of the Polarity Bit 501, along with the Range1 and Range0 bits are applied to NOR gate 505 in the event that the analog input signal is bipolar with an expected voltage swing between −10 and +10 volts. As illustrated, the input signal is sampled onto the third MSB of the CapDAC array in this case for proper scaling. Unique combinations of the control bits are mapped onto the inputs of different NOR gates so that six different input ranges may be selected for the SAR ADC via software programming.

Figure 6:
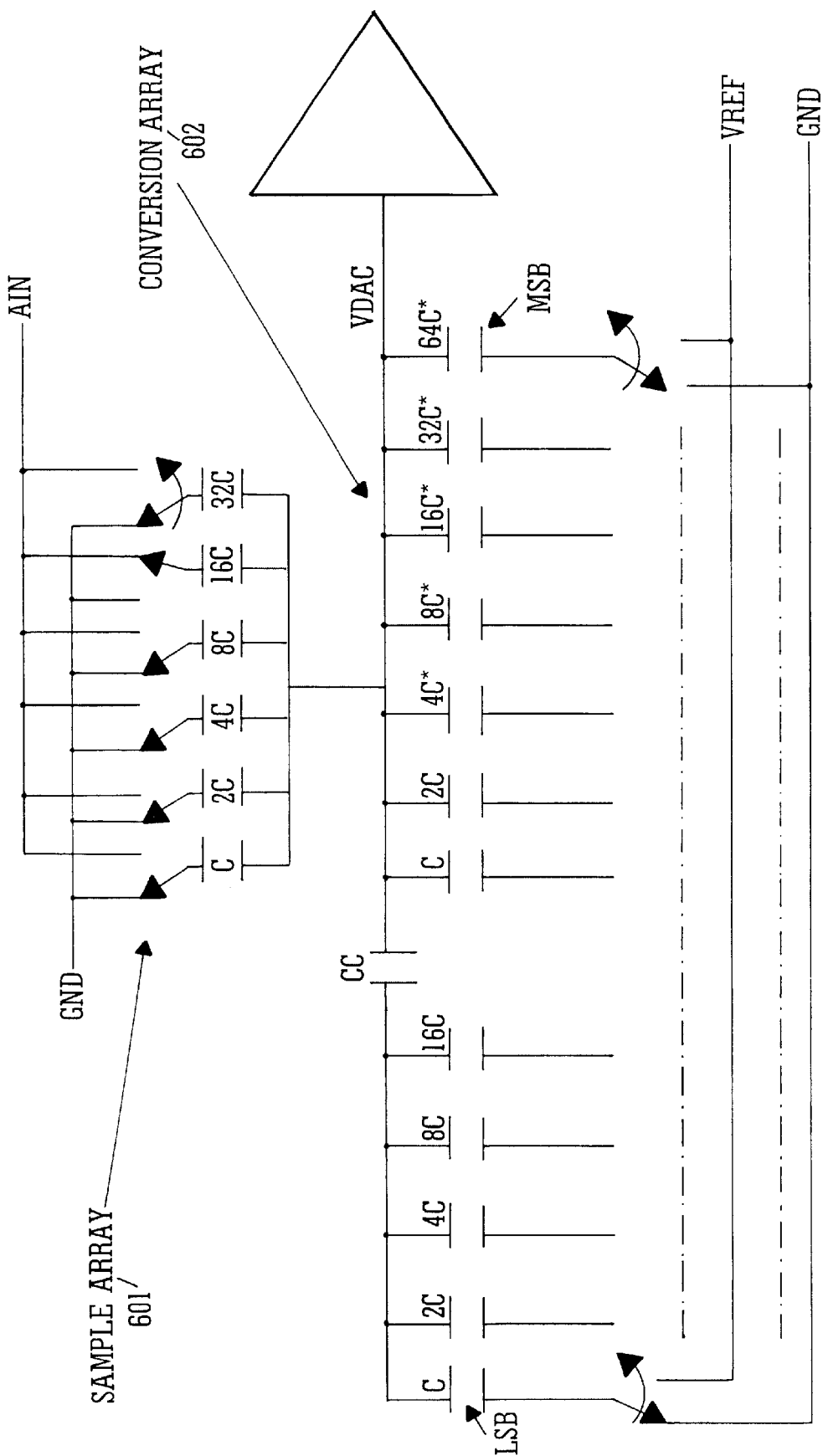
FIG. 6 illustrates a sampling array separate from the conversion array in accordance with an alternative embodiment of the present invention.

FIG. 6 illustrates an alternative embodiment of the invention in which the analog input signal is sampled onto a separate sample array 601, rather than electing to sample directly onto selected capacitors of the CapDAC conversion array 602. In this implementation, the selection logic selects one or more elements of the sample array 601 in order to program the range of the SAR ADC. The principal advantage of this configuration is that the number of high voltage switches required is substantially reduced. As one would expect, there is an associated saving in die area as well if a separate sampling array is used.

There has been described herein a programmable input range SAR ADC that offers distinct advantages when compared with the prior art. It will be apparent to those skilled in the art that modifications may be made without departing from the spirit and scope of the invention. Accordingly, it is not intended that the invention be limited except as may be necessary in view of the appended claims.

What is claimed is:

1. A programmable input voltage range analog-to-digital converter comprising:
   a successive approximation analog-to-digital converter (SAR ADC) having a characteristic dynamic range;
   an input voltage scaling network in which the input voltage is sampled onto one or more selected sampling capacitors to scale the input voltage to substantially match the characteristic dynamic range of the SAR ADC; and
   a network of high voltage sampling switches interposed between the input voltage and the input voltage scaling network.

2. The programmable input voltage range analog-to-digital converter of claim 1, wherein the input voltage scaling network is a capacitive redistribution digital-to-analog converter forming a part of the SAR ADC.

3. The programmable input voltage range analog-to-digital converter of claim 1, further comprising range decoder logic that selects one or more elements of the input voltage scaling network on which the input voltage is sampled.

4. The programmable input voltage range analog-to-digital converter of claim 3, wherein the input voltage range is bipolar.

5. The programmable input voltage range analog-to-digital converter of claim 4, wherein a network of low-voltage to high-voltage level shifters couples control signals to the high voltage sampling switches.

6. The programmable input voltage range analog-to-digital converter of claim 3, wherein the range decoder logic is responsive to a range selection control word written into an associated range register.

7. The programmable input voltage range analog-to-digital converter of claim 6, wherein the range register is programmable via a digital communication interface.

8. The programmable input voltage range analog-to-digital converter of claim 7, wherein the digital communication interface is a serial communication interface.

9. The programmable input voltage range analog-to-digital converter of claim 8, wherein the serial communication interface is bidirectional.

10. A SAR ADC comprising:
    a capacitive redistribution digital-to-analog converter (CapDAC) having an output coupled to a comparator;
    SAR logic that controls iterative sampling of a SAR ADC input signal and monitors the output of the comparator;
    an input voltage scaling network in which the input voltage is sampled onto one or more selected sampling capacitors to scale the input voltage to substantially match the characteristic dynamic range of the SAR ADC; and
    a network of high voltage sampling switches interposed between the input voltage and the capacitive redistribution DAC, such that the input voltage is selectively sampled onto one or more of the capacitors of the CapDAC array.

11. The SAR ADC of claim 10, wherein the capacitive redistribution DAC forms at least a part of the input voltage scaling network.

12. The SAR ADC of claim 10, further comprising range decoder logic that selects one or more elements of the CapDAC for input voltage sampling.

13. The SAR ADC of claim 12, wherein the input voltage range is bipolar.

14. The SAR ADC of claim 13, wherein a network of low-voltage to high-voltage level shifters couples control signals to the high voltage sampling switches.

15. The SAR ADC of claim 12, wherein the range decoder logic is responsive to a range selection control word written into an associated range register.

16. The SAR ADC of claim 15, wherein the range register is programmable via a digital communication interface.

17. The SAR ADC of claim 16, wherein the digital communication interface is a serial communication interface.

18. The SAR ADC of claim 17, wherein the serial communication interface is bi-directional.

19. A SAR ADC comprising:
    a capacitive redistribution digital-to-analog converter (CapDAC) having an output coupled to a comparator;
    SAR logic that controls iterative sampling of a SAR ADC input signal and monitors the output of the comparator;
    an input voltage scaling network in which the input voltage is sampled onto one or more selected sampling capacitors to scale the input voltage to substantially match the characteristic dynamic range of the SAR ADC;
    a network of high voltage sampling switches interposed between the input voltage and the input voltage scaling network, such that the input voltage is selectively sampled onto one or more of the sampling capacitors;
    range decoder logic that controls the network of high voltage sampling switches to select said one or more of the sampling capacitors; and
    a range register to which a range selection control word is written, the range decoder logic being responsive to the range selection control word.

20. The SAR ADC of claim 19, wherein the range register is programmable via an integral digital communication interface.

21. The SAR ADC of claim 20, wherein the digital communication interface is a serial communication interface.

22. The SAR ADC of claim 19, wherein the CapDAC forms at least a part of the input voltage scaling network, and the input voltage is sampled onto one or more selected sampling capacitors of the CapDAC to scale the input voltage to substantially match the characteristic dynamic range of the SAR ADC.

23. The SAR ADC of claim 19, wherein the input voltage scaling network comprises a network of sampling capacitors independent of the CapDAC array.

24. The SAR ADC of claim 19, wherein the input voltage range is bipolar.

* * * * *